(12) United States Patent
Chen

(10) Patent No.: US 6,373,699 B1
(45) Date of Patent: Apr. 16, 2002

(54) HEAT DISSIPATION DEVICE

(75) Inventor: Yun Long Chen, Chung-Ho (TW)

(73) Assignee: Foxconn Precision Components Co., Ltd., Taipei Hsein (TW)

( * ) Notice: Subject to any disclaimer, the term of this patent is extended or adjusted under 35 U.S.C. 154(b) by 0 days.

(21) Appl. No.: 09/746,266

(22) Filed: Dec. 21, 2000

(30) Foreign Application Priority Data

Aug. 29, 2000 (TW) ..................................... 89214934 U

(51) Int. Cl.⁷ .................................................. H05K 7/20
(52) U.S. Cl. ...................... 361/697; 361/695; 361/704; 257/722; 257/718; 257/719; 257/727; 174/16.3; 165/80.3
(58) Field of Search ................................ 361/704, 707, 361/709, 710, 695; 174/15.1, 16.3; 165/80.2, 80.3, 185; 257/713, 718, 719, 722, 727

(56) References Cited

U.S. PATENT DOCUMENTS 5,621,244 A * 4/1997 Lin ............................ 257/713
5,706,169 A * 1/1998 Yeh ............................ 361/690
5,771,966 A * 6/1998 Jacoby ........................ 165/185
5,969,949 A * 10/1999 Kim et al. ................... 361/704
6,009,937 A * 1/2000 Gonner et al. ............... 165/185
6,104,609 A * 8/2000 Chen .......................... 361/695
6,109,340 A * 8/2000 Nakase et al. ............. 165/80.3
6,176,304 B1 * 1/2001 Lee ............................ 165/185

* cited by examiner

*Primary Examiner*—Leo P. Picard
*Assistant Examiner*—Boris L. Chervinsky
(74) *Attorney, Agent, or Firm*—We Te Chung

(57) ABSTRACT

A heat dissipation device (1) includes a chassis (10) and a fin member (20). The chassis is formed as a single unit by extrusion, and includes a top surface (11). Four parallel ribs (13) are formed on the top surface. A pair of slots (14) is dfined in the top surface, adjacent the two outermost ribs. The slots are adapted for connection to a conventional fan frame (50). The fin member defines four grooves (21) and a channel (22) therethrough. The channel is between the innermost grooves, and is adapted to interferentially receive a conventional heat sink clip (60). The four grooves interferentially receive the ribs of the chassis, thereby securely attaching the fin member to the chassis.

12 Claims, 5 Drawing Sheets

HEAT DISSIPATION DEVICE

BACKGROUND OF THE INVENTION

1. Field of the Invention

The present invention relates to a heat dissipation device, and more particularly to a heat dissipation device which has enhanced heat removal capability.

2. Related Art

Many electronic devices, such as Central Processing Units (CPUs), generate a lot of heat during normal operation. This can deteriorate their operational stability. Thus the heat must be removed quickly to ensure normal operation of the electronic device. A heat dissipation device is often attached to a top surface of the electronic device, to remove heat therefrom.

A conventional heat dissipation device is shown in FIG. 5. The device 2 is conventionally formed by extrusion, which significantly limits the amount of heat dissipation surface which can be produced. Furthermore, the device 2 is relatively heavy compared to a typical electronic device which it is designed to service.

Another conventional heat dissipation device is shown in FIG. 6. The device 4 includes a chassis 6 defining a plurality of grooves (not labeled) therein, and a plurality of fins 8 inserted into the grooves. The heat dissipation surface of the device 4 is greater than that of the device 2. However, installation of the fins 8 into the chassis 6 is time-consuming and costly. Furthermore, during normal use entailing vibration and shock, the fins 8 of the device 4 are prone to dislodge within the grooves of the chassis 6. This results in gaps forming between the fins 8 and the chassis 6, thereby reducing the efficiency of heat transfer. Thus the heat dissipation device 4 does not reliably remove heat.

It is strongly desired to provide a heat dissipation device which resolves the above-mentioned problems.

SUMMARY OF THE INVENTION

Accordingly, an object of the present invention is to provide a heat dissipation device with a large surface area for increasing the efficiency of heat removal.

Another object of the present invention is to provide a heat dissipation device comprising two easily manufactured parts readily assembled together.

To achieve the above objects, a heat dissipation device in accordance with the present invention comprises a chassis and a fin member. The chassis is formed as a single unit by extrusion, and includes a top surface. Four parallel ribs are formed on the top surface. A pair of parallel slots is defined in the top surface adjacent respective outermost ribs, and is adapted for connection to a conventional fan frame. The chassis forms a pair of shoulders at respective opposite sides thereof, adapted to support the fan frame thereon. The fin member is formed from a single plate, and defines four parallel grooves and a channel therethrough. The channel is defined between the two innermost grooves, and is adapted to interferentially receive a conventional clip. The clip secures the heat dissipation device to a heat-generating electronic device. The four grooves interferentially receive the ribs of the chassis, thereby securely attaching the fin member to the chassis.

Other objects, advantages and novel features of the present invention will be drawn from the following detailed embodiment of the present invention with attached drawings, in which:

DETAILED DESCRIPTION OF THE PREFERRED EMBODIMENT

Figure 1:
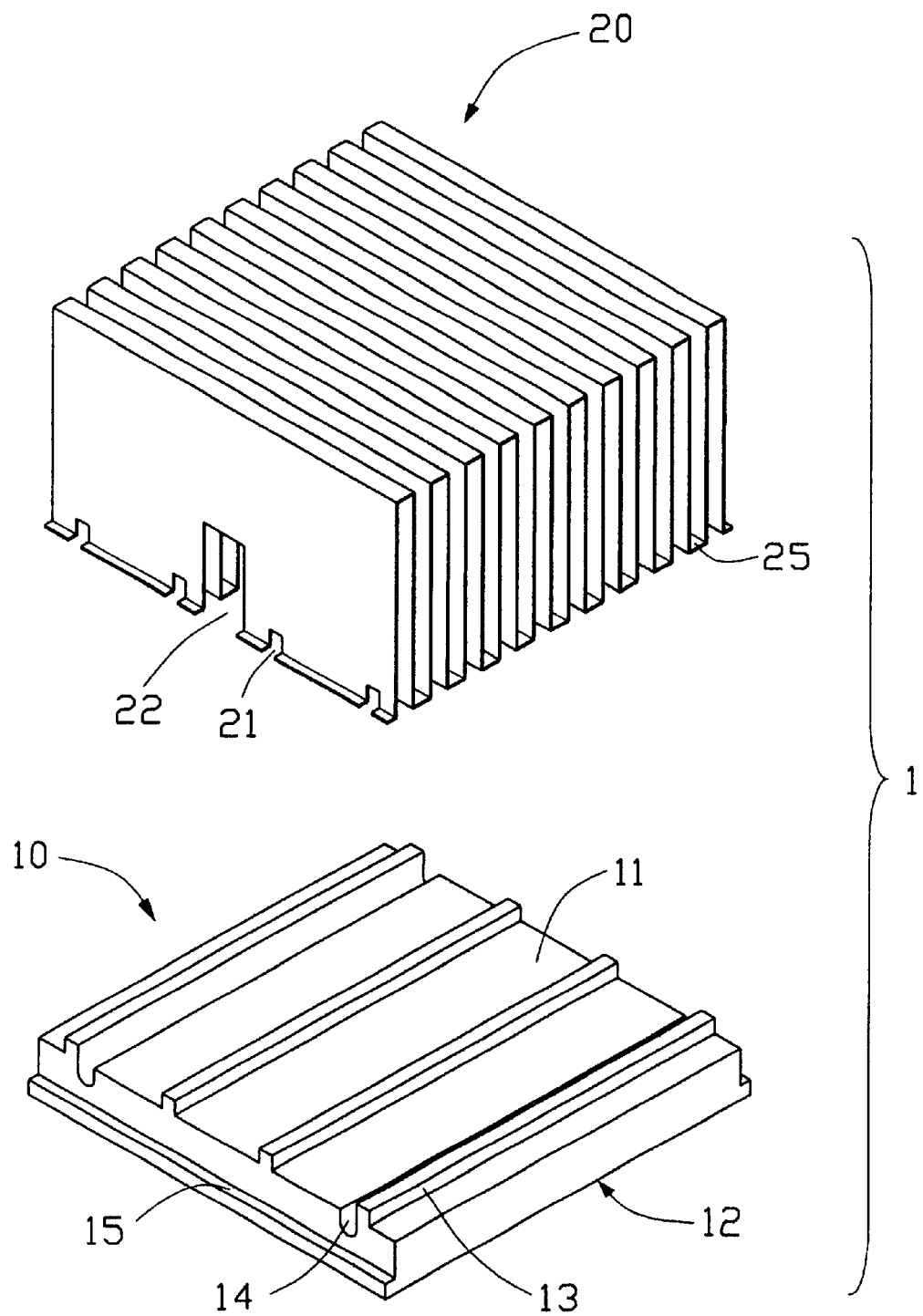
FIG. 1 is an exploded view of a heat dissipation device in accordance with the present invention.

Referring to FIG. 1, a heat dissipation device 1 in accordance with the present invention includes a chassis 10 and a fin member 20 interferentially mountable on the chassis 10.

The chassis 10 is formed as a single unit by extrusion, and comprises a top surface 11 and a bottom surface 12. Four parallel ribs 13 are formed on the top surface 11, at uniform intervals. A pair of U-shaped slots 14 is defined in the top surface 11, parallel to and adjacent innermost extremities of the respective outermost ribs 13. Thus each outermost rib 13 defines an outer limit of its adjacent slot 14. A pair of longitudinal shoulders 15 is formed at respective opposite sides of the chassis 10, the shoulders 15 being perpendicular to the ribs 13. An upper surface of each shoulder 15 is lower than the slots 14 of the chassis 10.

The fin member 20 is concertinaed from a single plate to provide maximum surface area for heat dissipation. The fin member 20 extends continuously with upper surfaces 24 and lower surfaces 25 alternately bridged by the vertical planes 26. Lower surfaces 25 of the fin member 20 are coplanar. Four parallel grooves 21 are defined throughout a bottom of the fin member 20, and are dimensioned to interferentially engage with the corresponding ribs 13 of the chassis 10. A channel 22 is defined throughout a bottom of the fin member 20, and extends in a direction perpendicular to the vertical planes 26. The channel 22 is parallel to the grooves 21, and is located between the two innermost grooves 21. The channel 22 is dimensioned to interferentially receive a conventional heat sink clip 60 (see FIG. 4).

Figure 2:
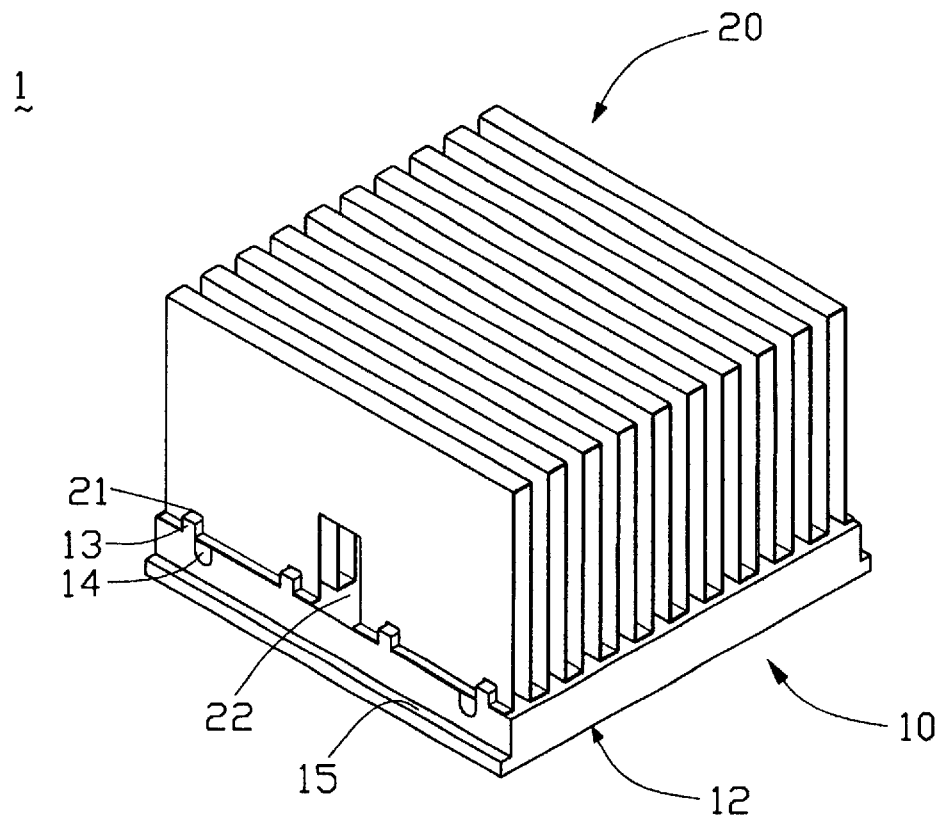
FIG. 2 is an assembled view of FIG. 1.
Figure 3:
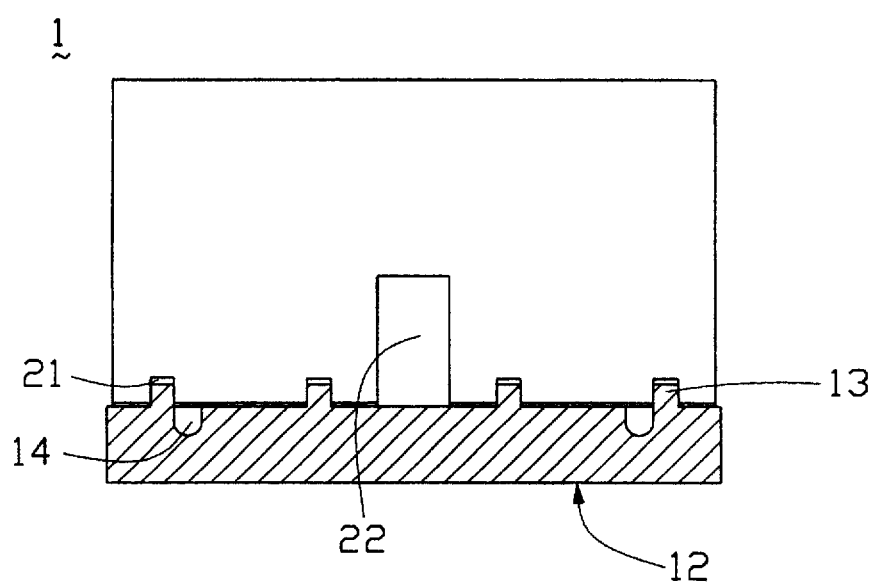
FIG. 3 is a side elevation view of FIG. 2.

Referring also to FIGS. 2 and 3, in assembly, the fin member 20 is placed on the chassis 10. The ribs 13 of the chassis 10 interferentially engage with the grooves 21 of the fin member 20. The lower surfaces 25 of the fin member 20 abut the top surface 11 of the chassis 10. Thus the heat dissipation device 1 is readily assembled for use as a single unit.

Figure 4:
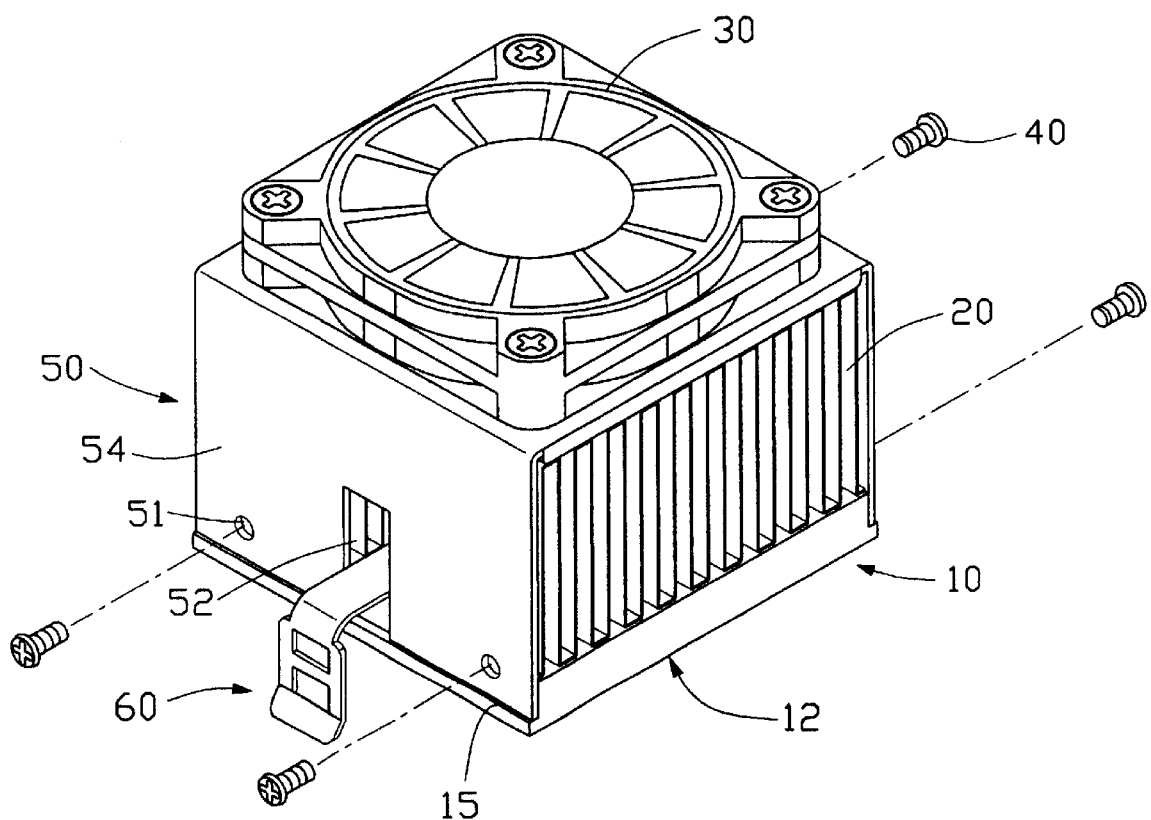
FIG. 4 shows the assembled heat dissipation device attached to a conventional heat sink clip and a conventional fan assembly.
Figure 5:
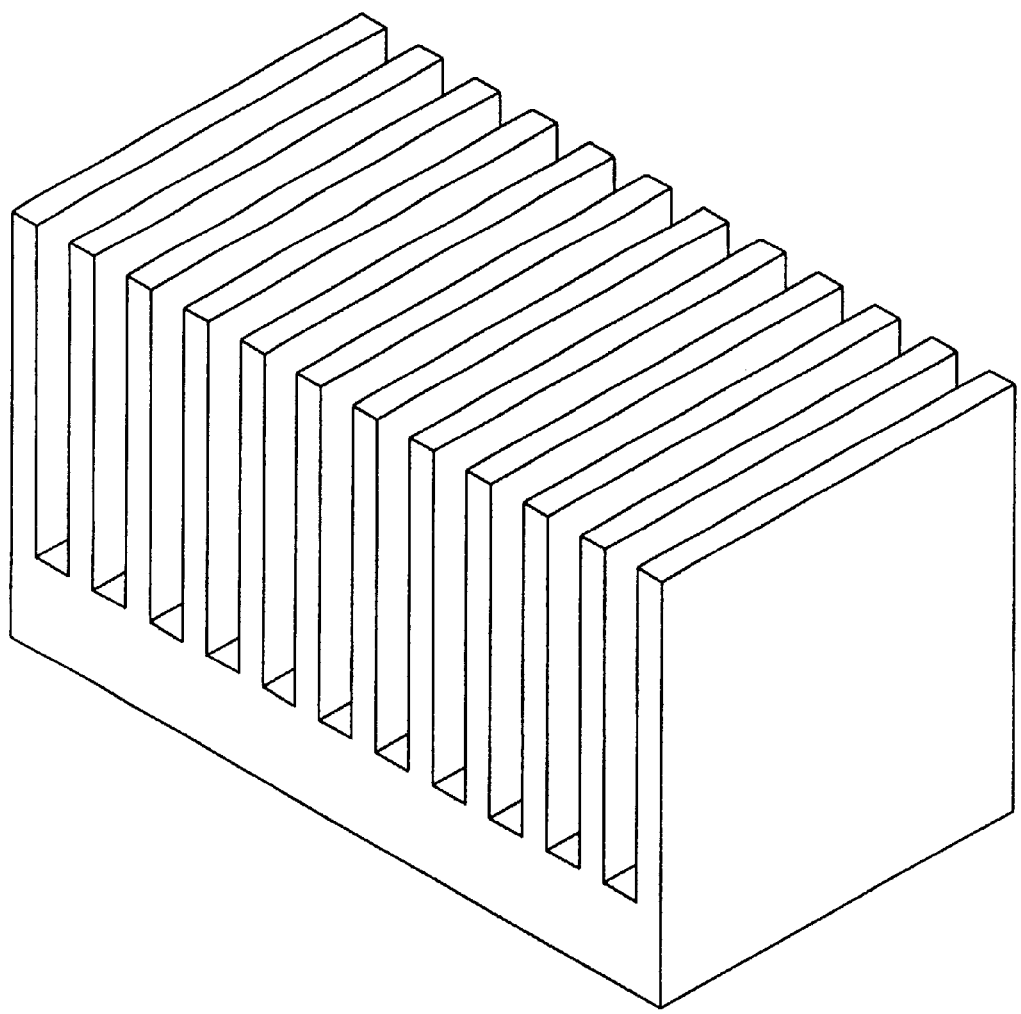
FIG. 5 is a perspective view of a conventional heat dissipation device.
Figure 6:
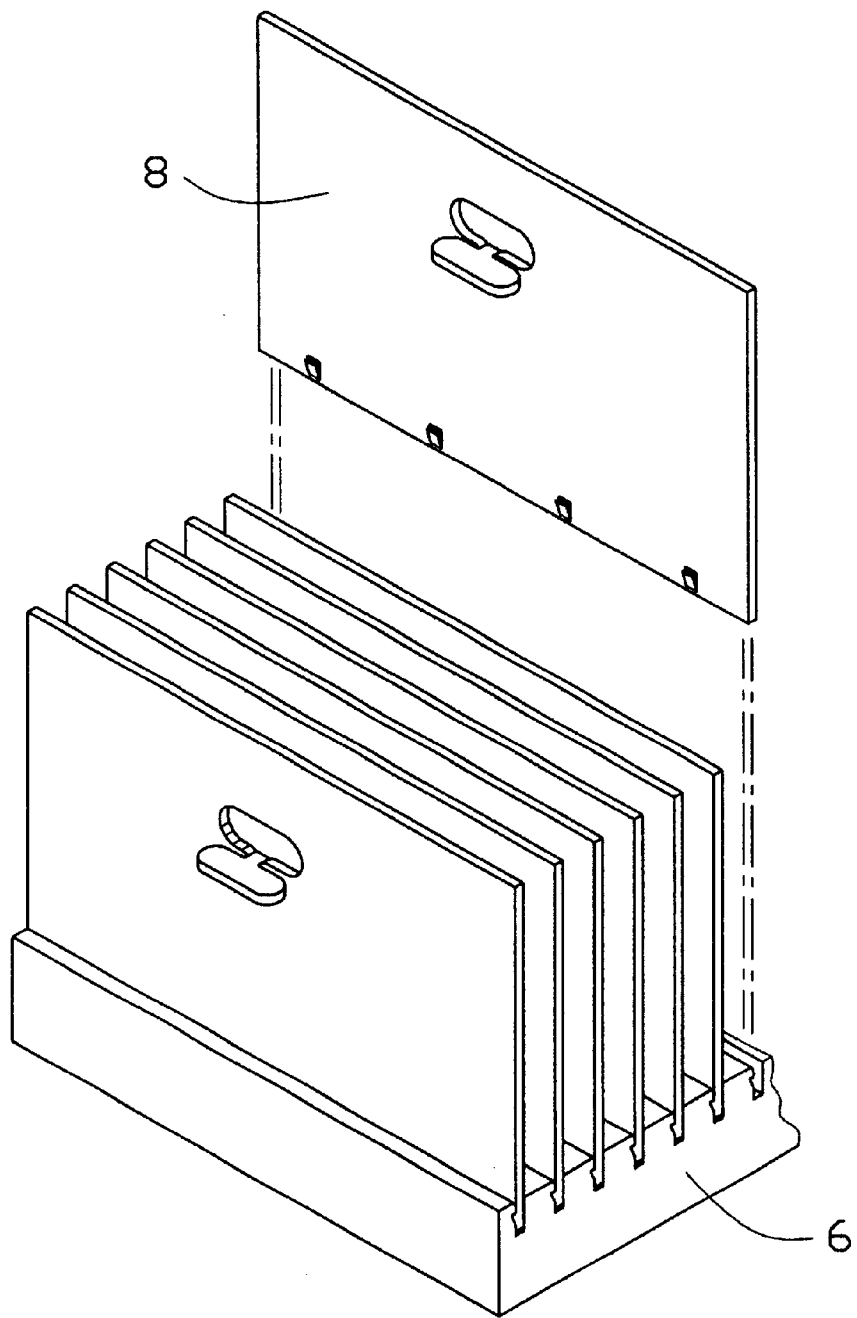
FIG. 6 is a perspective view of another conventional heat dissipation device.

Referring also to FIG. 4, the heat dissipation device 1 is adapted to readily receive the conventional heat sink clip 60 and a conventional fan assembly. The clip 60 is adapted to engage with a retention module (not shown), and thus secure the bottom surface 12 of the heat dissipation device 1 to an electronic device (not shown). The fan assembly comprises a fan 30 attached to a top of a fan frame 50 by conventional means, and screws 40 for attaching the fan frame 50 to the heat dissipation device 1.

The fan frame 50 is generally U-shaped, with an opening 52 defined at a bottom of each opposite sidewall 54. The openings 52 are located and dimensioned to correspond to the channel 22 of the fin member 20. A screw hole 51 is defined near each bottom corner of each sidewall 54 of the fan frame 50. The screw holes 51 are located and dimensioned to correspond to the slots 14 of the chassis 10.

Final assembly entails putting together the heat dissipation device 1, the clip 60 and the fan assembly. The clip 60 is received in the channel 22 of the fin member 20. The fan frame 50 is placed over the fin member 20, such that bottom edges (not labeled) of the sidewalls 54 of the fan frame 50 abut respective shoulders 15 of the chassis 10. The screws 40 are inserted into the screw holes 51 of the fan frame 50, and then screwed into the slots 14 of the chassis 10. The channel 22 of the fin member 20 and the openings 52 of the fan frame 50 cooperate to prevent the heat dissipation device 1 from moving relative to the clip 60 in a normal direction.

Other advantages of the heat dissipation device 1 include:

1. The chassis 10 is easily extruded from a single plate. The fin member 20 is also easily formed from a single plate. The plate for the fin member 20 is first stamped to specification, and then concertinaed. Thus manufacture of the heat dissipation device 1 is simple.

2. Since the chassis 10 and the fin member 20 are made separately before being coupled together, the fin member 20 is produced without the limitations inherent in extrusion processes. Thus the fin member 20 can be readily manufactured to have a large surface area for enhanced heat dissipation capability.

3. Since the chassis 10 and the fin member 20 are made separately before being coupled together, they can be readily formed from different materials. The material of the chassis 10 can be selected to provide maximum heat transfer from an electronic device, and the material of the fin member 20 can be selected to provide maximum heat dissipation from the fin member 20.

It is understood that the invention may be embodied in other forms without departing from the spirit thereof. Thus, the present example and embodiment is to be considered in all respects as illustrative and not restrictive, and the invention is not to be limited to the details given herein.

What is claimed is:

1. A heat dissipation device adapted for removing heat from a heat-generating electronic device comprising:
   a chassis comprising at least one rib on a top surface thereof; and
   a fin member comprising a plurality of vertical planes perpendicular to the at least one rib and at least one groove being perpendicularly defined through the vertical planes, each groove interferentially receiving the corresponding rib of the chassis therein to thereby secure the fin member to the chassis, the fin member further defining a channel therethrough adapted for receiving a clip, the channel being parallel to the at least one groove.

2. The heat dissipation device as recited in claim 1, wherein the fin member comprises a plurality of integrally concertinaed fins.

3. The heat dissipation device as recited in claim 1, wherein the fin member comprises coplanar lower surfaces for abutting the top surface of the chassis.

4. The heat dissipation device as recited in claim 1, wherein the chassis comprises four ribs and the fin member defines four grooves, for providing the heat dissipation device with high stability and simple configuration.

5. The heat dissipation device as recited in claim 1, wherein the chassis defines at least one slot adapted for attaching a fan frame thereto.

6. The heat dissipation device as recited in claim 1, wherein the chassis forms at least a shoulder adapted for abutting a fan frame.

7. A heat dissipation device comprising:
   a chassis;
   a fin member separated from the chassis, the fin member comprising a plurality of parallel spaced vertical planes standing on the chassis;
   a channel extending through bottom portions of said vertical planes in a direction perpendicular to said vertical planes while not through said vertical plane in a vertical direction;
   a clip portioned on the chassis and received in the channel; and
   means for fitting said fin member and said chassis together; wherein
   said clip is protected under said vertical planes.

8. The device as recited in claim 7, wherein said vertical planes are successively interconnected with one another by alternate upper and lower surfaces.

9. The heat dissipation device as recited in claim 7, wherein said means extends in a direction parallel to said direction that said channel extends in.

10. A heat dissipation device comprising:
    a chassis with a plurality of parallel spaced ribs extending along a first direction thereon;
    a fin member concertinaed from a single plate with alternate upper and lower surfaces interconnected with one another via vertical planes, said vertical planes extending along a second direction perpendicular to said first direction; and
    a plurality of grooves defined throughout bottom portions of the vertical planes along said first direction and interferentially engaging said corresponding ribs, respectively.

11. The device as recited in claim 10, wherein a channel extends throughout the bottom portions of the vertical plane to receive a clip therein.

12. The device as recited in claim 11, wherein said channel extends along the first direction.

* * * * *